(12) United States Patent
Narche

(10) Patent No.: US 7,027,350 B2
(45) Date of Patent: Apr. 11, 2006

(54) DEVICE AND METHOD FOR PARTIAL READ-PROTECTION OF A NON-VOLATILE STORAGE

(75) Inventor: Pascal Narche, Peynier (FR)

(73) Assignee: STMicroelectronics S.A., (FR)

( * ) Notice: Subject to any disclaimer, the term of this patent is extended or adjusted under 35 U.S.C. 154(b) by 0 days.

(21) Appl. No.: 10/474,260

(22) PCT Filed: Mar. 22, 2002

(86) PCT No.: PCT/FR02/01018

§ 371 (c)(1),
(2), (4) Date: May 19, 2004

(87) PCT Pub. No.: WO02/082459

PCT Pub. Date: Oct. 17, 2002

(65) Prior Publication Data

US 2004/0208058 A1 Oct. 21, 2004

(30) Foreign Application Priority Data

Apr. 5, 2001 (FR) .................................. 01 04638

(51) Int. Cl.
*G11C 11/00* (2006.01)
(52) U.S. Cl. .................... 365/230.06; 365/230.01; 365/230.03; 365/230.08
(58) Field of Classification Search .......... 365/230.06, 365/230.01, 230.08, 230.03
See application file for complete search history.

(56) References Cited

U.S. PATENT DOCUMENTS 4,488,217 A * 12/1984 Binder et al. ............... 710/200
4,797,808 A * 1/1989 Bellay et al. ................. 714/30
4,959,860 A * 9/1990 Watters et al. .............. 713/202

(Continued)

FOREIGN PATENT DOCUMENTS

JP        401106244  A  *  4/1989

OTHER PUBLICATIONS

International Search Report issued in connection with International Application No. PCT/FR02/01018 as completed on Jul. 15, 2002, by the ISA/EP.

*Primary Examiner*—Viet Q. Nguyen
(74) *Attorney, Agent, or Firm*—Jenkens & Gilchrist P.C.

(57) ABSTRACT

A device for read protection of at least one area of a non-volatile memory includes an address decoder outputting an addressing signal on one of its output terminals when an the address corresponds to one of the read protected areas of the memory. A state memory is provided for each read protected area to output a state signal indicating whether or not the area is protected in read. A program instructions decoder outputs a program signal indicating whether or not the current addressing operation corresponds to a program instruction. A logic circuit responsive to the addressing signal, the state signal and the program signal outputs an instruction signal to read the read protected area when the program signal indicates that the current addressing operation is applicable to a program instruction.

8 Claims, 2 Drawing Sheets

U.S. PATENT DOCUMENTS

| | | | | |
|---|---|---|---|---|
| 5,457,790 A | * | 10/1995 | Iwamura et al. | 711/167 |
| 5,526,311 A | * | 6/1996 | Kreifels et al. | 365/201 |
| 5,560,036 A | * | 9/1996 | Yoshida | 712/227 |
| 5,594,793 A | | 1/1997 | Bahout | 380/4 |
| 5,652,900 A | * | 7/1997 | Yoshida | 718/100 |
| 5,680,581 A | * | 10/1997 | Banno et al. | 710/38 |
| 6,088,262 A | | 7/2000 | Nasu | 365/185.04 |
| 6,160,734 A | | 12/2000 | Henderson et al. | 365/185.04 |
| 6,665,796 B1 | * | 12/2003 | Folmsbee | 713/190 |
| 6,789,150 B1 | * | 9/2004 | Jain | 710/305 |

* cited by examiner

DEVICE AND METHOD FOR PARTIAL READ-PROTECTION OF A NON-VOLATILE STORAGE

PRIORITY CLAIM

This application is a nationalization under 35 U.S.C. 371 of international application PCT/FR02/01018 (WO 02/082459) which claims priority from French Application for Patent No. 01/04638 file Apr. 5, 2001, this disclosures of which are hereby incorporated by reference.

BACKGROUND OF THE INVENTION (1) Field of the Invention

The invention relates to non-volatile type of electronic memories associated with a microcontroller so that the microcontroller can carry out operations in accordance with instructions and data contained in the memories. In particular, it relates to a device and a method of providing protection for one or several parts or sectors or areas of these memories against unauthorized reading.

(2) Description of Related Art

It is known how to globally protect a memory against writing and/or reading by preventing access to the memory in write and/or in read as soon as a protection bit has been put into a specific state or a fuse has been "burned".

Although the memory is protected in read, it must be accessible in read if a read request is made as a result of a program instruction. Consequently, a memory protected in read must also be protected in write to prevent a fraudor from being able to write a program of instructions into the memory accessible in write, in order to read the read protected memory.

Therefore, one purpose of this invention is to make a device capable of protecting all or part of a non-volatile type of electronic memory against unauthorized reading, in other words reading that does not correspond to execution of an instruction code.

BRIEF SUMMARY OF THE INVENTION

This purpose is achieved by protecting some determined parts of the memory against reading, except when it is detected that the next instruction is contained in an address corresponding to one of these determined parts, and in this case the part of memory corresponding to this address is no longer protected so that the contents of this address can be read.

Each part protected against reading is defined by its addressing codes such that address decoder used to decode them outputs a memory selection signal. This selection signal only authorizes reading of this protected part if the microcontroller outputs a signal indicating that the purpose of the operation is to execute the code contained in the address.

The construction of the address decoder controls which parts can be protected against reading, and each part that will actually be protected is determined by the state of a memory cell, to be fixed by the developer. The state signal of this memory cell controls whether or not the microcontroller signal will be taken into account indicating that it is a code execution operation.

The invention relates to a device for read protection of at least one area of a non-volatile memory, comprising:

an address decoder to output an addressing signal on one of the output terminals when the address corresponds to one of the read protected areas of the memory, a state memory for each read protected area to output a state signal indicating whether or not the area is protected in read, a program instruction decoder to output a program signal indicating whether or not the current addressing operation corresponds to a program instruction, and a logic circuit to which the addressing signal, the state signal and the program signal are applied, and that outputs an instruction signal to read the read protected area when the program signal indicates that the current addressing operation is applicable to a program instruction.

The logic circuit comprises the following for each read protected memory area:

a logical OR gate, in which one of the input terminals is connected to the output terminal of a state memory corresponding to the area considered, and for which the other input terminal is connected to the output terminal of the program instruction decoder to receive the program signal, and a locking circuit, for which the input terminal is connected to the output terminal of the address decoder corresponding to the area considered, and for which the clock input terminal is connected to the output terminal of the logical OR gate, and for which its output terminal is connected to one of the input terminals of a logical AND gate, the said logic circuit also comprising a logical AND gate for which the input terminals are connected to the corresponding output terminals from the locking circuits and output terminals from the address decoder corresponding to memory areas not protected in read.

The invention also relates to a method of providing read protection for at least one area of a non-volatile memory, that comprises the following steps:

(a) divide the memory into a plurality of areas,
(b) choose at least one area to be read protected,
(c) detect addressing of a cell in memory in one of the chosen areas,
(d) determine if the current addressing relates to a program instruction being executed, and
(e) enable reading of the memory cell in the read protected area if the response to step (d) is positive, and otherwise disable reading.

BRIEF DESCRIPTION OF THE DRAWINGS

Other special features and advantages of this invention will become clear after reading the following description of a particular example embodiment, the said description being made with relation to the attached drawings in which.

DETAILED DESCRIPTION OF THE INVENTION

Figure 1:
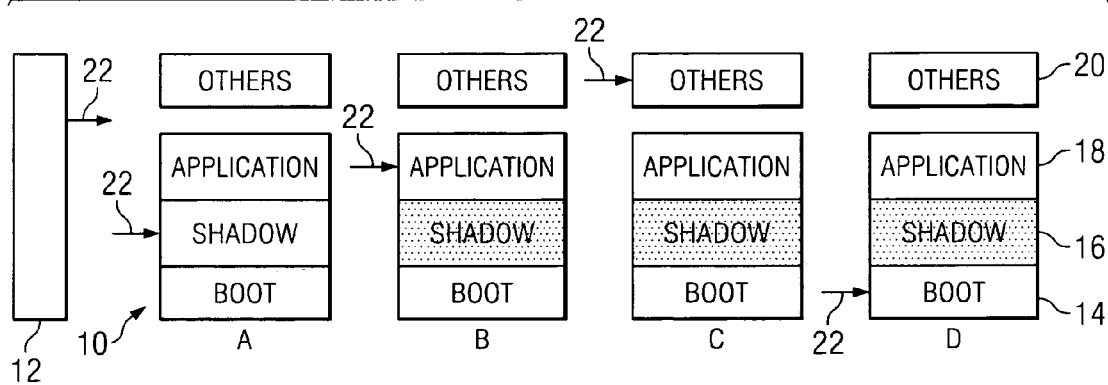
FIG. 1 is a diagram showing a given organization of non-volatile memory to implement the invention.

The invention is implemented by assigning a non-volatile memory 10 to save programs to be executed under the control of a microcontroller 12 and dividing this memory into several parts or areas 14, 16 and 18, each part being assigned to a specific program category.

For example, part 14 called the "BOOT" part contains the boot program to be executed after a reset; part 16, called "APPLI", contains the application program(s); part 18, called "SHADOW", contains the program(s) that the developer would like to prevent being read other than for the purpose of executing an instruction code.

There may be other memories 20 separate from the memory 10, called "OTHERS", that are also controlled by the microcontroller 12.

The diagram in FIG. 1 shows four cases of addressing memories 10 and 20.

In the first case A, the program counter (arrow 22) of the micro-controller 12 points to an address of the "SHADOW" part 18 so as to read the contents at the address pointed to for execution. This part 18 and the other parts 14, 16 and 20 are not read protected.

In the second case B, the program counter points to an address of the "APPLI" part 16. Only the "SHADOW" part 18 is read protected (cross-hatched area).

In the third case C, the program counter points to an address in the "OTHERS" part 20. In this case also, only the "SHADOW" part 18 is read protected.

In the fourth case D, the program counter points to an address of the "BOOT" part 14. Only the "SHADOW" part 18 is read protected.

The "BOOT" part is an essential part without which the microcontroller 12 could not start.

The "SHADOW" part 18 contains programs into which a first card user writes to implement application programs.

The "APPLI" part 16 contains application programs written by a second user of the card.

It may be important that the second user, or the "second" user, cannot be allowed read access to programs contained in the "SHADOW" part 18, so as to prevent pirating or fraud.

According to the invention, this "SHADOW" part 18 is read protected unless the addressing made by the microcontroller 12 in the SHADOW part is related to execution of an instruction.

Figure 2:
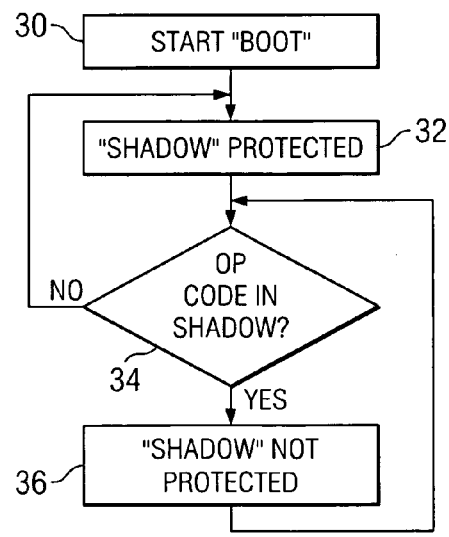
FIG. 2 is an explanatory diagram showing the operating principle of the device according to the invention.

FIG. 2 shows the operating principle of the invention.

On initialization, the "BOOT" program 30 puts the "SHADOW" part 18 in the read protection state 32.

The microcontroller 12 determines if the next execution code is written in the "SHADOW" part (step 34). If the response is positive, the "SHADOW" part is no longer read protected, in other words the read protection is removed (state 36).

If the response is negative, the "SHADOW" part remains read protected and reading is impossible.

Figure 3:
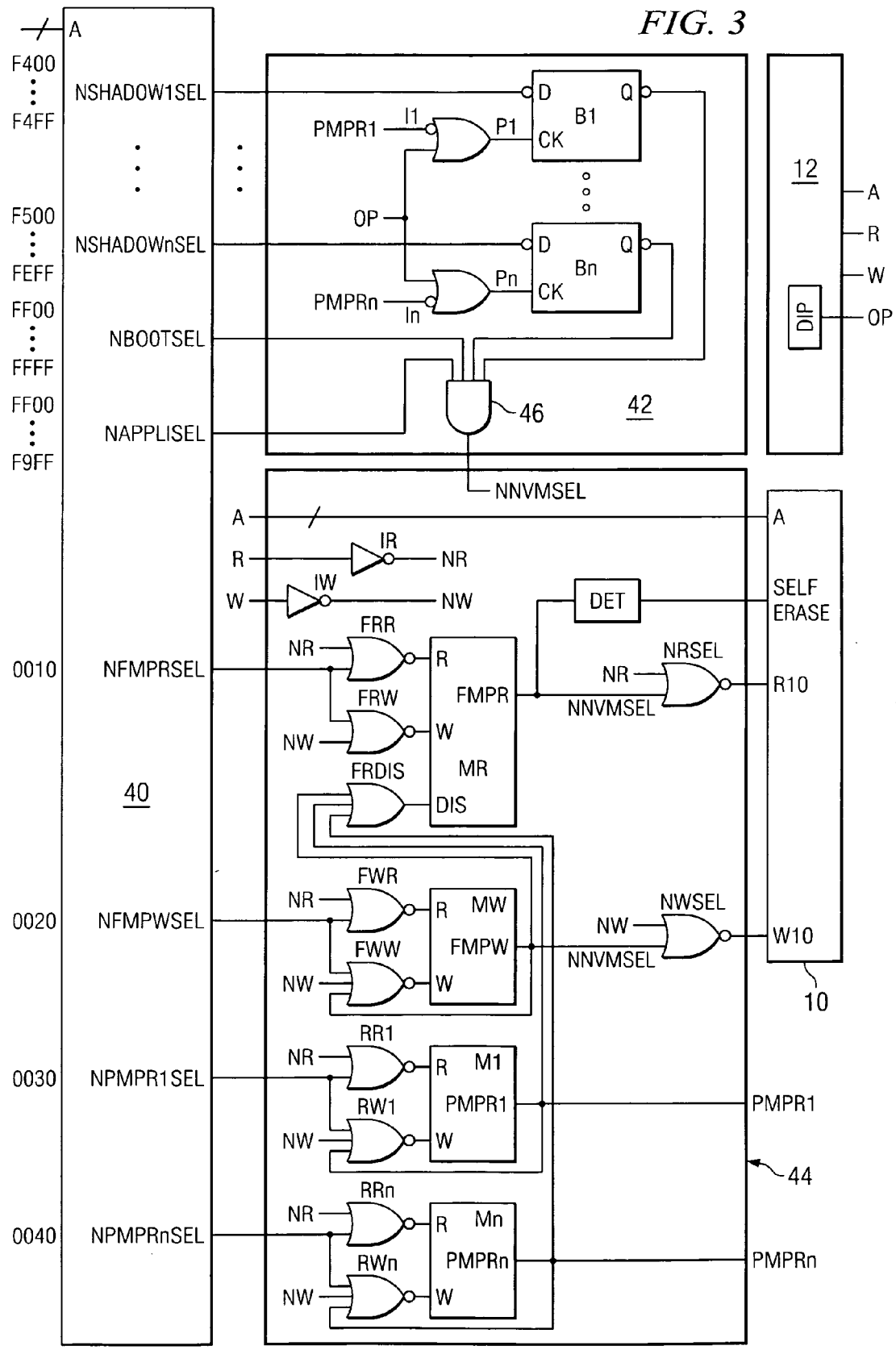
FIG. 3 is a diagram of a partial read protection device for a non-volatile memory according to the invention.

We will now describe a partial read protection device for the non-volatile memory 10 in detail, with relation to the diagram in FIG. 3.

This device is designed to use not more than n SHADOW type parts or areas that are determined by their address code. These n SHADOW type areas are distributed at several locations in memory 10.

The device comprises:
an address decoder 40 that receives address codes A from the microcontroller 12,
a selection logic circuit 42, and
a circuit 44 to write the protection states of n SHADOW type parts or areas and the global protection state of the memory 10 in write and in read.

The address decoder 40 is of the conventional type and outputs signals indicating which part of the memory is addressed by a code A.

Thus, it outputs a NAPPLISEL signal when the address code A corresponds to an address of the APPLI part of the memory 10, for example hexadecimal codes F000 to F3FF.

It outputs an NBOOTSEL signal when the address code A corresponds to an address of the BOOT part of the memory 10, for example hexadecimal codes FF00 to FFFF.

It outputs an NSHADOW1SEL signal when the address code A corresponds to an address of a first SHADOW type area of memory 10, for example hexadecimal codes F400 to F4FF.

It outputs an NSSHADOWnSEL signal when the address code A corresponds to an address in the $n^{th}$ SHADOW type area of memory 10.

All these decoding signals are applied to the selection logic circuit 42 that comprises:
n type D locking circuits B1 to Bn, one for each SHADOW type area, for which the input terminal D is connected to one of the output terminals from the address decoder that outputs one of the NSHADOW1SEL signals to NSHADOWnSEL,
n OR gates P1 to Pn, the output terminal of which is connected to the clock terminal CK of one of the locking circuits B1 to Bn respectively; one of the two input terminals of each gate P1 to Pn is connected to one of the n state memories M1 to Mn of the write circuit 44 through invertors I1 to In, while the other input terminal is connected to an output terminal OP from the microcontroller 12 for which the signal indicates that the next instruction code is written in a SHADOW type area,
an AND circuit 46 with (n+2) input terminals that are connected to the NAPPLISEL output terminal, and to the NBOOTSEL output terminal of the address decoder 40 and to an output terminal Q of the n locking circuits B1 to Bn; the output terminal from the AND circuit 46 is connected to the write circuit 44.

The write circuit 44 comprises:
n state memories M1 to Mn to write the read protection state of each of the SHADOW type areas,
a memory MW to write the global protection state of the memory 10 in write,
a memory MR to write the global protection state of the memory 10 in read,
and various logical gates that will be described below.

Each state memory M1 to Mn and the memories MW and MR have two input terminals R and W connected to an output terminal from the address decoder 40 through a complementary OR type logical gate, more frequently known as a NOR gate.

Thus, the NPMPR1SEL output terminal corresponding to decoding of code 0030, is connected to the input terminal R of memory R1 through a gate RR1, and to the input terminal W through a gate RW1.

The same is true for the other output terminals until the nth terminal NPMPRnSEL corresponding to code 0040, that is connected to input terminal R of memory Mn through a gate RRn, and to the input terminal W through a gate RWn.

Similarly, the output terminal NFPMSEL corresponding to code 0020 is connected to the input terminal R of the memory MW through a gate FWR and to the input terminal W through a gate FWW.

The NFMPRSEL output terminal corresponding to code 0010 is connected to the input terminal R of the memory MR through a gate FRR and to the input terminal W through a gate FRW.

Each of these NOR logical gates has a second input terminal connected to the output terminal R or W from the microcontroller 10 through a corresponding inverter circuit IR or IW, the output terminals providing the read signal R and write signal W.

The circuit 44 also comprises two other NOR logical gates referenced NRSEL and NWSEL, the output terminals of which are connected to the input terminal R10 and the input terminal W10 respectively of memory 10.

The NRSEL gate comprises three input terminals, the first of which is connected to the output terminal from the AND circuit 46 of the circuit 42 that outputs the MNVMSEL signal, the second is connected to the output terminal of the IR inverter that outputs the NR signal, and the third is connected to the output terminal from the state memory MR.

The MWSEL gate comprises three input terminals, the first of which is connected to the output terminal from the AND gate 46 of the circuit 42 that outputs the NNVMSEL signal, the second is connected to the output terminal from the inverter IW that outputs the NW signal, and the third is connected to the output terminal of the state memory MW.

In addition to the two input terminals R and W, the state memory MR comprises a third input terminal DIS connected to the output terminal from a logical OR gate reference FRDIS that comprises (n+1) input terminals. One of these input terminals is connected to the output terminal of the memory MW, and the other n are connected to the corresponding output terminals of the memories M1 to Mn.

The circuit 44 also comprises a detector circuit DET that detects when the memory MR output terminal changes from "1" to "0"; this detector circuit outputs an erase memory signal 10 that is applied to the SELFERASE input terminal.

Note that the input terminals of state memories MW and M1 to Mn are looped back to the input terminal W through the corresponding logical NOR gate. The purpose of this circuit is to ensure that only one write can be made into the state memory.

State memories M1 to Mn are set to state 1 only if the corresponding part of memory 10 has to be read protected, this part of memory being determined by the NSHADOW1SEL to NSHADOWnSEL decoding signal. State memories M1 to Mn are selected in read or in write respectively by the NPMPR1SEL to NPMPRnSEL signals. As soon as a state memory M1 to Mn is set equal to the read protection state 1, the signal for this state 1 is applied to the state memory write input through gate RW1 to RWn so as to confirm this state 1 and to prevent it from changing from state 1 to state 0.

The state memory MW writes a state equal to 1 if the entire memory 10 is fully write protected, and the loop between its output terminal and its input terminal W through the gate FWW confirms this protection so as to prevent a change from state 1 to state 0.

The state memory MR writes a state 1 to identify the fact that the entire memory 10 is fully read protected, in the same way as it writes states 1 of state memories M1 to Mn to identify protection of part of the memory 10. This state memory MR is selected in read or write by an NFMPRSEL decoding signal, and its output terminal is connected to the third input terminal of the NRSEL NOR gate and to a detector circuit DET detecting a change from state 1 to state 0.

We will now describe operation of the device in FIG. 3, assuming that the memory 10 is fully write protected (FMPW=1), and is read protected for the memory area 10 corresponding to the NSHADOW1SEL decoding signal (PMPR1=1). The other state memories MR and M2 (not shown) to Mn are in state 0, in other words the corresponding areas are not read protected.

If a selection address for memory 10 causes the appearance of the decoding signal NSHADOW1SEL, this level 0 signal is applied to the input terminal D of the locking circuit B1. Furthermore, the PMPR1 signal indicating that this memory area is read protected is applied to gate P1 through an inverter circuit I1 such that the input terminal is in state 0.

If the microcontroller 12 does not output the OP signal indicating that it is an instruction, the P1 gate will not supply any signal on its output terminal. Therefore the clock input terminal CK of the locking circuit B1 will not receive any signal such that state 0 of the input terminal D is not transmitted on the output terminal Q that remains in state 1. The signal for this state 1 applied to the AND gate 46 outputs a state signal 1 on its output terminal, state 1 that is inactive, in other words the NNVMSEL selection signal is in state 1 such that the output terminal from the NRSEL gate is in state 0 that prevents reading. If the microcontroller 12 outputs an OP pulse, the OR gate P1 transmits this OP pulse that is applied to the input terminal CK to transmit the state of the input terminal D to the output terminal Q such that the state of the output terminal Q changes to 0. This state 0 signal, applied to the AND gate 46, supplies the NNVMSEL selection signal to the NRSEL gate. Since the other input terminals are in state 0, the output terminal is in state 1 enabling reading of memory 10 at the address indicated.

If a selection address to memory 10 causes the NSHADOWnSEL decoding signal to appear, this level 0 signal is applied to the input terminal D of the locking circuit Bn. Furthermore, the PMPRn signal=0 indicating that this memory sector is not read protected, is applied to the OR gate Pn through the inverter circuit In, so that the corresponding input terminal is in state 1.

The output terminal from this gate Pn is in state 1 and this signal is applied to terminal CK to transmit state 0 from the input terminal D to the output terminal Q, such that the state signal 0 outputs the NNVMSEL selection signal that enables reading of a memory cell in this sector regardless of whether the OP signal is present (instruction code) or absent (no instruction).

When a memory area is read protected, it is also write protected due to the state memory MW and the MWSEL gate. The NNVMSEL signal is in state 0, such that the output terminal from gate NWSEL is in state 0 and prevents writing.

As indicated above, current memories include state memories MW and MR, the purpose of which is to protect the entire memory against a write access (FMPW=1) or a read access (FMPR=1).

A detector DET is also provided to detect when the state memory MR changes from state 1 to state 0, and in this case a protection device automatically erases the entire memory 10 since this state change is considered as being a fraudulent attempt to read the memory.

However, for the read protected SHADOW area, it is necessary that FMPR=0 which means that it is possible for the state to change from 1 to 0, and therefore to erase itself. This state change is prevented by the fact that the state memory MR cannot write a state 0 if there is a SHADOW area.

This is achieved using the OR circuit referenced FRDIS that stops a zero from being written when one of the state memories M1 to Mn is in state 1.

Writing of a zero is also blocked when the memory 10 is write protected with FMPW=1. This blocking is used in the case in which the memory 10 is a flash memory used as permanent memory. This is achieved by write protecting the entire memory 10, since FMPW=1 and the state memory MR is prevented from changing to state 0 through the FRDIC gate, which prevents self-erase and consequently prevents the FLASH memory from being rewritten.

The above description defines the steps in a method of providing read protection for at least one area of a non-volatile memory 10, characterized in that it comprises the following steps:
(a) divide the memory 10 into a plurality of areas,
(b) choose at least one area to be read protected,
(c) detect addressing of a cell in the memory 10 in one of the chosen areas,
(d) determine if the current addressing relates to a program instruction being executed, and
(e) enable reading of the memory cell in the read protected area if the response to step (d) is positive, and otherwise disable reading.

The invention claimed is:

1. Device for read protection of at least one area of a non-volatile memory, comprising:
an address decoder outputting an addressing signal on one of its output terminals when an address corresponds to one of the read protected areas of the memory,
a state memory for each read protected area outputting a state signal indicating whether or not the area is protected in read,
a program instructions decoder outputting a program signal indicating whether or not the current addressing operation corresponds to a program instruction, and
a logic circuit to which the addressing signal, the state signal and the program signal are applied, and that outputs an instruction signal to read the read protected area when the program signal indicates that the current addressing operation is applicable to a program instruction.

2. Device according to claim 1, wherein the logic circuit comprises the following for each read protected memory area:
a logical OR gate, in which one of the two input terminals is connected to the output terminal of the state memory corresponding to the area considered, and for which the other input terminal is connected to the output terminal of the program instructions decoder to receive the program signal, and
a locking circuit, whose input terminal is connected to the output terminal of the address decoder corresponding to the area considered, and whose clock input terminal is connected to the output terminal of the logical OR gate, and whose output terminal is connected to one of the input terminals of a logical AND gate,
the said logic circuit also comprising a logical AND gate whose input terminals are connected to the corresponding output terminals of the locking circuits and the output terminals of the address decoder corresponding to memory areas not protected in read.

3. Device according to claim 1 or 2, wherein each state memory comprises a memory cell selected in read or write by an address signal of the address decoder and for which the output terminal is connected to the write input terminal to prevent any new write when the memory cell has been put in the state indicating that the corresponding area is write protected.

4. Device according to claim 3, further comprising:
a second state memory composed of a memory cell selected in read or in write by an addressing signal of the address decoder, a first state "1" corresponding to a global read protection of the memory and a second state "0" corresponding to a lack of global read protection,
a detector detecting when the second state memory changes from state "1" to state "0" to output a signal representative of this change so as to control self erasing of the memory, and
a logical OR gate for which the input terminals are connected to the output terminals of the state memories of areas that might be read protected and for which the output terminal is connected to the state memory indicating whether or not the memory is globally read protected to prohibit writing a state "0" when an area state memory is in the read protection state and thus prevent the self erase.

5. Device according to claim 4, further comprising:
a third state memory composed of a memory cell selected in read or in write by an addressing signal of the address decoder, a first state "1" corresponding to global write protection of the memory and a second state "0" corresponding to a lack of write protection,
a inverted logical OR gate, with the following applied to its input terminals:
to the first terminal, a signal indicating whether or not it is a write operation
to the second terminal, a signal indicating if the selection relates to a cell in one of the read protected areas
to the third terminal, the state signal for the third state memory indicating the global write protection state of the memory
the output terminal of the global write protection third state memory is connected to an input terminal of the OR circuit to prevent a self erase of the memory when the memory has a global write protection.

6. Method of providing read protection for at least one area of a non-volatile memory 10, comprising:
(a) dividing the memory 10 into a plurality of areas,
(b) choosing at least one area to be read protected and associating a state memory with each read protected area to output a state signal indicating whether or not the area is protected in read,
(c) detecting addressing of a cell in the memory 10 in one of the chosen areas,
(d) determining if the current addressing relates to a program instruction being executed, and
(e) enabling reading of the memory cell in the read protected area if the response to determining is positive, and otherwise disable reading.

7. A circuit comprising:
a non-volatile memory having a plurality of addressable areas therein, at least one of those addressable areas being a read protected area;
a state memory associated with the addressable read protected area in the non-volatile memory, a certain state of the state memory indicating that the addressable read protected area is protected in read; and
a logic circuit responsive to the certain state of the state memory and an indication that a current non-volatile memory addressing operation to the addressable read protected area corresponds to a program instruction for permitting a read access to the addressable read protected area.

8. The circuit of claim 7 wherein the non-volatile memory is on a card.

* * * * *